United States Patent
Hotta et al.

(10) Patent No.: US 6,947,282 B2
(45) Date of Patent: Sep. 20, 2005

(54) ELECTRONIC DEVICE, LIQUID COOLING SYSTEM AND TANK

(75) Inventors: Daichi Hotta, Chigasaki (JP); Yasushi Neho, Atsugi (JP); Yuichi Kondo, Ebina (JP); Kenichi Saitou, Tokyo (JP); Rintaro Minamitani, Tsukuba (JP); Shigeo Ohashi, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 56 days.

(21) Appl. No.: 10/406,379

(22) Filed: Apr. 4, 2003

(65) Prior Publication Data

US 2004/0001312 A1 Jan. 1, 2004

(30) Foreign Application Priority Data

Jun. 28, 2002 (JP) ........................................ 2002-188937
Jul. 12, 2002 (JP) ........................................ 2002-203456

(51) Int. Cl.⁷ ............................................... H05K 7/20
(52) U.S. Cl. ...................... 361/699; 361/687; 361/720; 165/104.32; 165/104.33
(58) Field of Search ......................... 361/683, 687–699, 361/701, 719–724; 174/15.1, 15.2, 16.1, 16.3; 165/80.3, 80.4, 104.33, 185; 312/223.1–223.6; 62/507, 259.2

(56) References Cited

U.S. PATENT DOCUMENTS

| | | | | |
|---|---|---|---|---|
| 3,989,102 A | * | 11/1976 | Jaster et al. ............ | 165/104.31 |
| 4,197,512 A | * | 4/1980 | Brenac ......................... | 372/35 |
| 5,048,599 A | * | 9/1991 | Tustaniwskyj et al. | 165/104.32 |
| 5,535,818 A | * | 7/1996 | Fujisaki et al. ......... | 165/104.33 |
| 6,404,640 B1 | * | 6/2002 | Ishimine et al. ............ | 361/720 |
| 6,519,147 B2 | * | 2/2003 | Nakagawa et al. ......... | 361/687 |
| 6,711,017 B2 | * | 3/2004 | Kurokawa et al. .......... | 361/699 |
| 6,741,464 B2 | * | 5/2004 | Kitano et al. ................ | 361/687 |
| 6,755,626 B2 | * | 6/2004 | Komatsu et al. .......... | 417/413.2 |
| 6,757,169 B2 | * | 6/2004 | Kondo et al. ................ | 361/699 |
| 6,795,312 B2 | * | 9/2004 | Narakino et al. ........... | 361/687 |
| 2003/0151892 A1 | * | 8/2003 | Kondo et al. ................ | 361/687 |

FOREIGN PATENT DOCUMENTS

| | | |
|---|---|---|
| JP | 6-125188 | 5/1994 |
| JP | 9-268386 | 10/1997 |
| JP | 2000-18611 | 1/2000 |

* cited by examiner

Primary Examiner—Michael Datskovskiy
(74) Attorney, Agent, or Firm—Mattingly, Stanger, Malur & Brundidge, P.C.

(57) ABSTRACT

An electronic device capable of preventing air from entering a pump for circulating a cooling medium is provided in a small-sized electronic computer provided with a liquid cooling system, which has a liquid cooling construction for circulating a cooling liquid with the use of a power source and for cooling a high temperature part of with the cooling liquid. The electronic device of the invention comprises a gas entering preventing mechanism provided in a part of a circulating path, through which the cooling liquid circulates, to prevent air from entering the power source.

9 Claims, 10 Drawing Sheets

FIG.6(a)    FIG.6(b)    FIG.6(d)
            FIG.6(c)
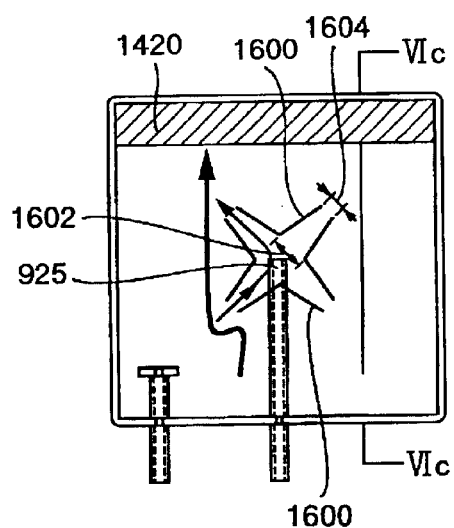
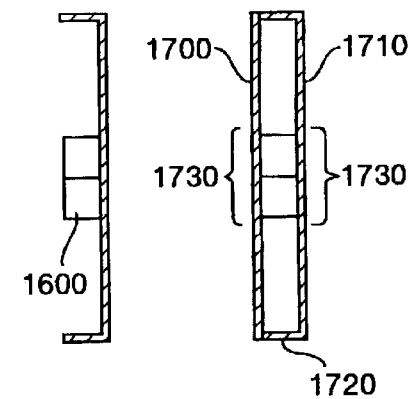
FIG.6(e)    FIG.6(f)
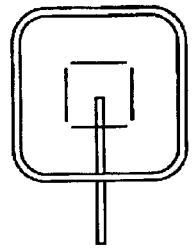
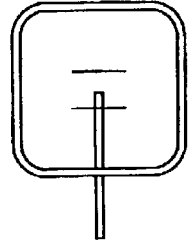
FIG.6(g)    FIG.6(h)
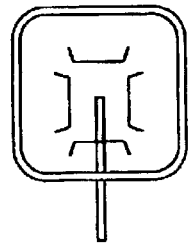
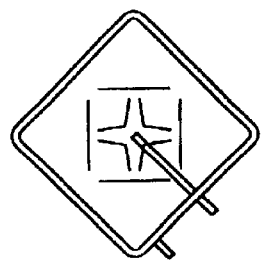

ELECTRONIC DEVICE, LIQUID COOLING SYSTEM AND TANK

BACKGROUND OF THE INVENTION

The present invention relates to technology of electronic devices typified by personal computers provided with a cooling construction by means of a cooling liquid.

The prior art of electronic devices, in which heat generating elements are cooled by a liquid medium (cooling liquid), is disclosed in, for example, JP-A-6-125188 and JP-A-9-268386.

In a liquid cooling system for cooling an electronic device with the use of a cooling liquid, a pump provided in the device circulates a cooling liquid through a metallic pipe and the circulating cooling liquid makes heat exchange with a heat generating element such as CPUs or the like to perform cooling. In such liquid cooling system, the cooling liquid evaporates from a circulating path, which must be sealingly closed, and gas enters the circulating path, whereby the cooling liquid is in some cases decreased to become short.

Therefore, the publications disclose a configuration, in which a cooling liquid tank is arranged in a piping system of a liquid cooling system for cooling a heat generating part of an electronic device. A tank is arranged in the liquid cooling system and a cooling liquid is filled in the tank and a decreased amount of the cooling liquid is supplemented.

In a liquid cooling system, in which a piping system is not filled with a cooling liquid, a phenomenon such as idle running will occur when gas enters a pump in the case where the pump has a low self-priming capability. With such phenomenon, in the prior art, there is a problem that a high cooling effect is not obtained. Also, since air entrained into the pump generates sound, there is caused a need of taking quieting measures.

Further, in the prior art, plastics are used as a material of a tank. With the tank made of such material, permeation or evaporation of cooling liquid from the tank proceeds and air accordingly enters the tank. Thus, the prior art involves problems that air corresponding to the evaporated cooling liquid enters the liquid cooling system and a decrease in the cooling liquid leads to degradation in cooling capability.

BRIEF SUMMARY OF THE INVENTION

It is an object of the invention to provide an electronic device constructed to reduce an amount of air entering a pump of a liquid cooling system.

It is a further object of the invention to provide an electronic device constructed to reduce permeation of a cooling liquid from a tank.

An electronic device according to the present invention comprises a liquid cooling construction for circulating a cooling liquid with the use of a power source to cool a high temperature part with the cooling liquid, and gas entering preventing mechanism for preventing entering of an air into the power source.

Alternatively, an electronic device according to the present invention comprises an evaporation preventing construction provided at that portion of a liquid cooling construction with a cooling liquid, in which evaporation of the cooling liquid or entering of air frequently occurs.

Other objects, features and advantages of the invention will become apparent from the following description of the embodiments of the invention taken in conjunction with the accompanying drawings.

BRIEF DESCRIPTION OF THE DRAWINGS

FIG. 4 shows an example of a cooling liquid tank according to the present invention in which an outflow end is arranged at a center of the tank; in which

FIG. 5 shows an example of a cooling liquid tank according to the present invention in which projections are provided in the vicinity of an outflow end; in which

FIG. 6 shows an example of a cooling liquid tank according to the present invention in which gas blocking walls are provided in the vicinity of an outflow end; in which FIG. 6(a) is a front view of the tank with a cover plate thereof removed, FIGS. 6(b) and 6(c) are cross sectional views taken along a line VIc—VIc in FIG. 6(a) and respectively showing the cover plate and a tank body, FIG. 6(d) is a cross sectional view showing the tank with the cover mounted, and FIGS. 6(e) to 6(h) are front views of other tanks.

DETAILED DESCRIPTION OF THE PREFERRED EMBODIMENTS

Figure 1:
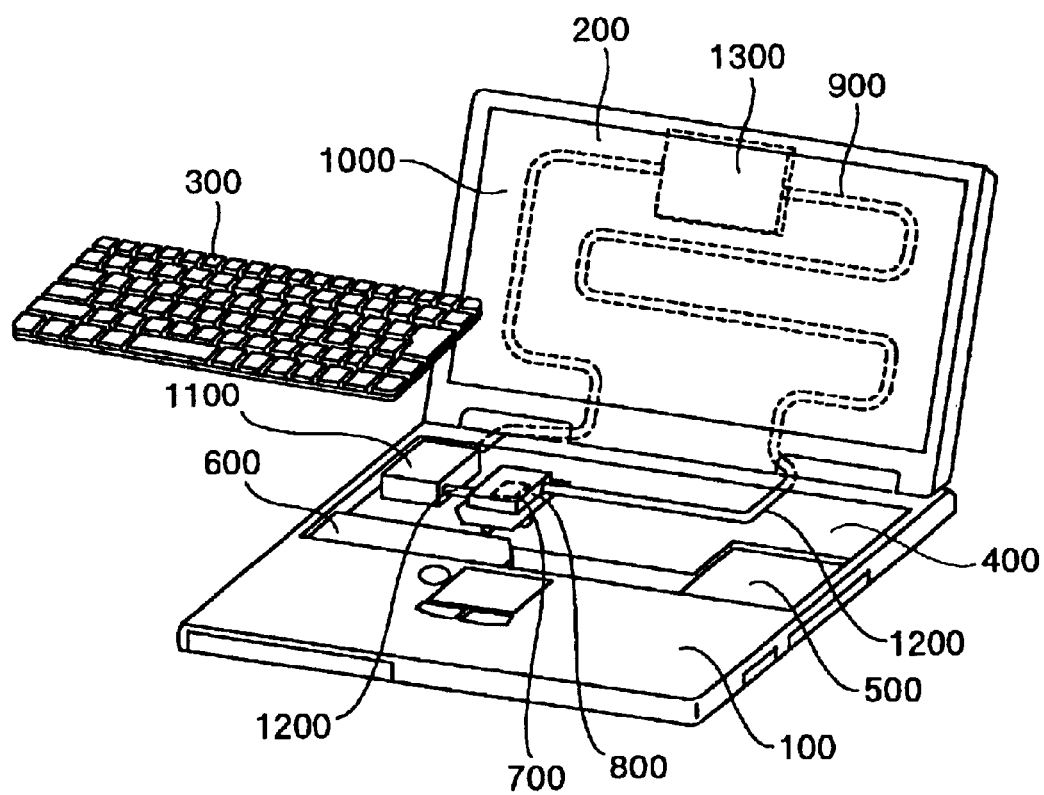
FIG. 1 is a perspective view of an embodiment of an electronic device according to the present invention.

Embodiments of the invention will be described below in detail with reference to the drawings. In all the drawings for the illustration of the embodiments, constituents having the same function are denoted by the same reference numerals, and a repeated explanation therefor is omitted.

FIG. 1 is a perspective view of an electronic device, to which the invention is applied. In this embodiment, a liquid cooling construction will be schematically described using a notebook-sized personal computer as an example of the electronic device. In particular, in the notebook-sized personal computer, there is possibility that air enters a pump when the computer is carried, or a cooling liquid tank is mounted in an operating section of the computer. In addition, hereinafter, dotted lines indicate an internal configuration.

Referring to FIG. 1, the electronic device comprises a body casing 100 and a display casing 200 provided with a display 1000. The display casing 200 may be made of a material such as a metal (for example, aluminum alloy, magnesium alloy, or the like) having a good thermal conduction.

A keyboard 300 is arranged on an upper surface of the body casing 100. For the sake of explanation, the keyboard 300 is shown as being removed.

Mounted in the body casing 100 are a circuit board 400 on which a plurality of circuit elements are mounted, a hard disk drive 500, an auxiliary storage means (for example, flexible drive, CD drive, or the like) 600, or the like.

Loaded on the circuit board 400 is a heat generating part having a large calorific power, for example, a CPU (central processing unit) 700 (referred below to as CPU). A liquid cooling jacket 800 is mounted on the CPU 700. The liquid cooling jacket 800 is in thermal contact with the CPU 700 to absorb heat generated from the CPU 700 to conduct the heat to a cooling liquid. The CPU 700 and the liquid cooling jacket 800 are connected to each other through a soft heat conducting member (for example, silicone rubber mixed with a thermally conductive filler such as aluminum oxide, or the like).

Also, mounted in the body casing 100 is a pump 1100 serving as a power source for circulating a liquid medium (cooling liquid, for example, water, nonfreezing fluid, or the like) in a liquid cooling mechanism.

A heat radiating mechanism is mounted inside a back surface of the display casing 200. The liquid cooling mechanism is constituted by the heat radiating mechanism, the liquid cooling jacket 800, which serves as a heat absorbing mechanism, and the pump 1100.

The heat radiating mechanism inside the display casing 200 comprises heat radiating pipes 900 and a tank 1300. The tank 1300 is arranged in an upper portion of the display casing 200. The tank 1300 and the heat radiating pipes 900 are connected with each other.

The reference numeral 1300 denotes the cooling liquid tank to store a cooling liquid and to replenish the liquid cooling mechanism with the cooling liquid. That is, even when the cooling liquid evaporates from the cooling system, an adequate cooling capability is preserved until a liquid level in the tank 1300 reaches a critical liquid level illustrated in FIG. 4.

The heat radiating pipes 900 are installed in the display casing 200 in a zigzag manner. The heat radiating pipes 900 serve as a main mechanism for radiating heat generated from the CPU 700.

The liquid cooling jacket 800, pump 1100, heat radiating pipes 900, and tank 1300 are connected together by a connection member, for example, flexible tubes 1200. The liquid cooling jacket 800, heat radiating pipes 900, and tank 1300 constitute a circulation path, through which the cooling liquid circulates, and thus the cooling liquid charged into the circulation path is circulated by the pump 1100.

Heat generated from the CPU 700 is conducted to the cooling liquid flowing through the liquid cooling jacket 800. While the cooling liquid passes through the heat radiating pipes 900 installed on the back surface of the display 1000, the heat is radiated outside through the back surface of the display casing 200. That cooling liquid, which has been lowered in temperature after radiation of heat, is fed to the liquid cooling jacket 800 through the pump 1100.

Figure 2:
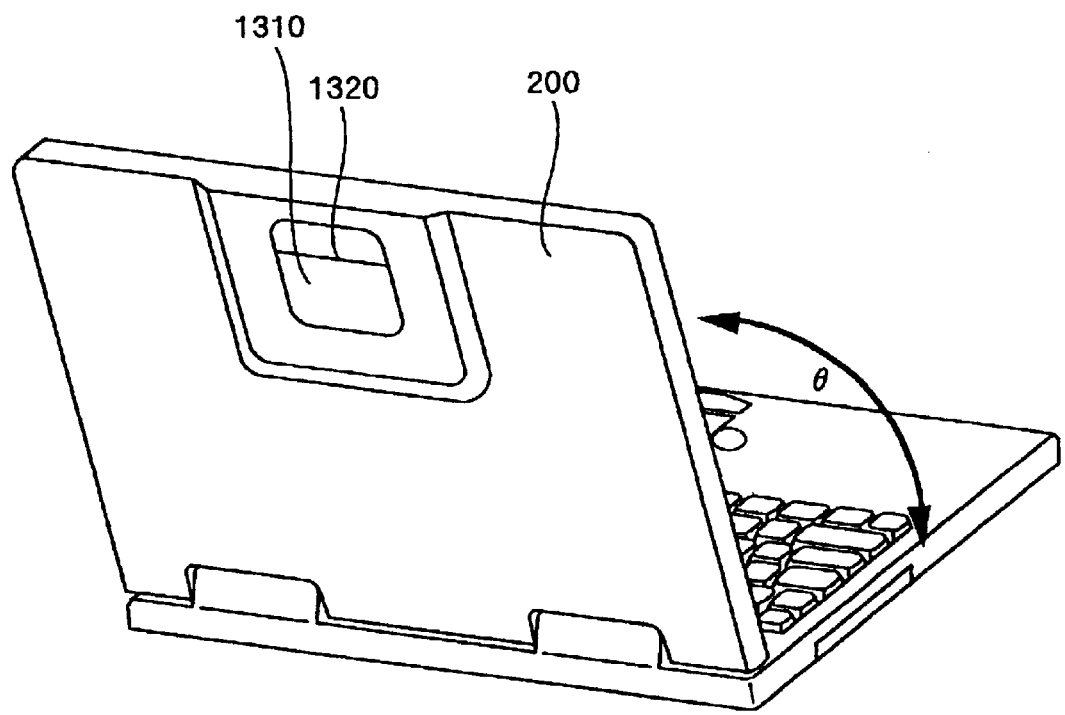
FIG. 2 is a perspective view of the embodiment of the electronic device according to the invention as viewed from a back surface thereof.

FIG. 2 is a view showing the back surface of the notebook-sized personal computer according to the present embodiment (in a state, in which the display casing 200 is opened at an angle theta from a closed state which is at angle 0 degree). As shown in FIG. 2, the tank 1300 is large in surface area as compared with the heat radiating pipes 900.

Also, provided in an upper portion of the back surface of the display casing 200 is a tank window 1310, through which the tank housed in the casing is seen. A state of the cooling liquid in the tank can be seen from the tank window. In FIG. 2, the reference numeral 1320 denotes a level of the cooling liquid. An increase or decrease in inner pressure caused by contraction/expansion of the cooling liquid and a gaseous part is generated in the circulation path of the liquid cooling mechanism. Accordingly, in the present embodiment, a predetermined amount (for example, 15% of a whole volume of the liquid cooling mechanism) of air is mixed in view of pressure caused by expansion in volume when the cooling liquid is raised in temperature.

Figure 3:
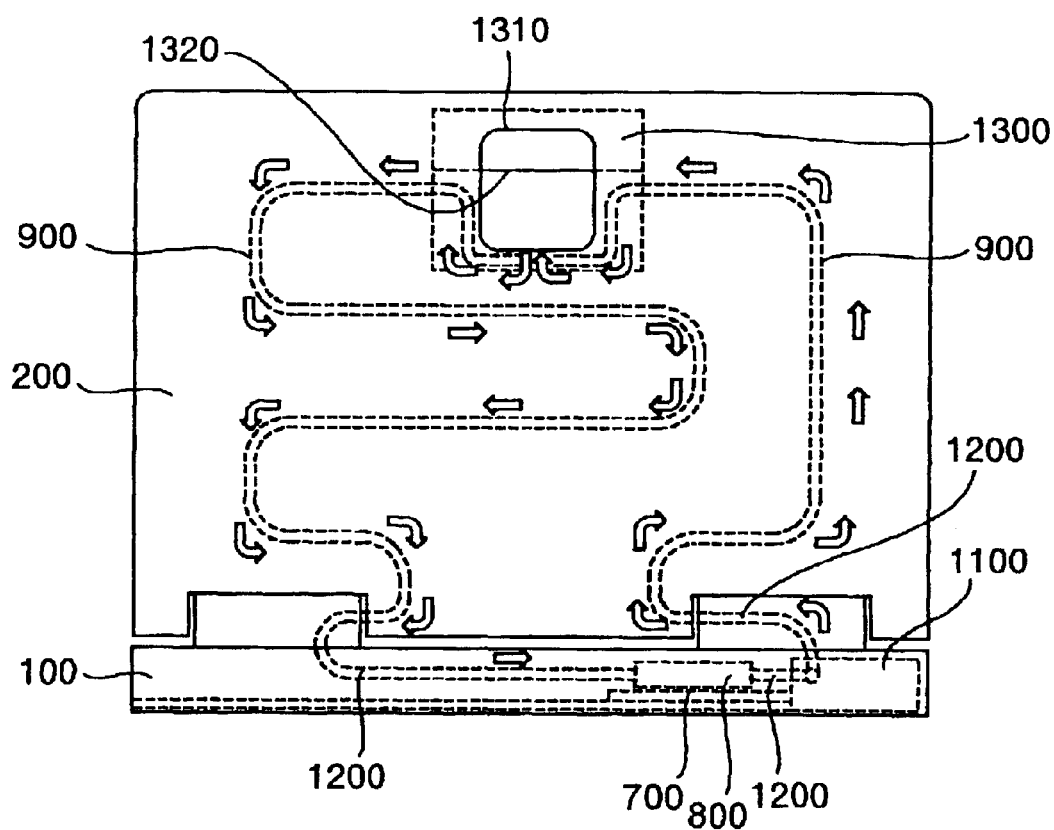
FIG. 3 is a view showing the back surface of the embodiment of the electronic device according to the invention.

FIG. 3 is a view showing the back surface of the electronic device according to the embodiment (in a state in which the display casing 200 is opened). In use of notebook-sized personal computers, a state, in which the display casing 200 is opened as shown in FIG. 3, occurs in the highest frequency. In the embodiment, the cooling liquid circulates in a direction indicated by arrows shown in the drawing.

In FIG. 3, the cooling liquid tank 1300 is preferably arranged in a level equivalent to the highest position of the heat radiating pipes 900, or in a position above the heat radiating pipes 900. This is because the arrangement of the tank in the upper portion of the display casing 200 makes it possible to improve an effect that heat is radiated from the tank having a large area. Also, a gaseous layer can be easily formed in the tank 1300.

Also, the heat radiating pipes 900 are inserted downward into the cooling liquid tank 1300, so that the cooling liquid is discharged downward from the heat radiating pipes 900. That is, the cooling liquid flows out in a direction opposed to a direction in which an air is easy to move at a state that the frequency is the highest in use of notebook-sized personal computers. With such arrangement, a part of gas in the gaseous layer can be made hard to enter the heat radiating pipes 900.

Then, a gas entering preventing mechanism according to the invention will be described with reference to FIGS. 4 to 8. The gas entering preventing mechanism according to the invention serves as a mechanism for inhibiting gas mixed in the cooling liquid from flowing into the pump 1100, or gas such as air from entering the pump 1100, in the case where gas such as air is mixed in the cooling liquid.

Figure 4A:
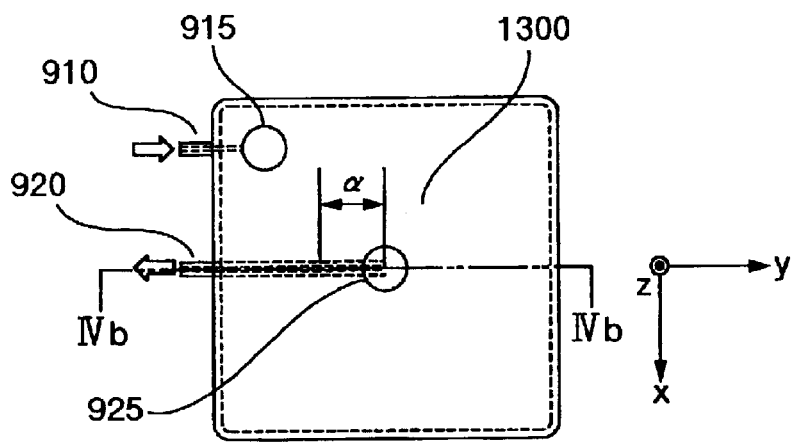
FIG. 4(a) is a view showing the tank viewed from a front thereof.
Figure 4B:
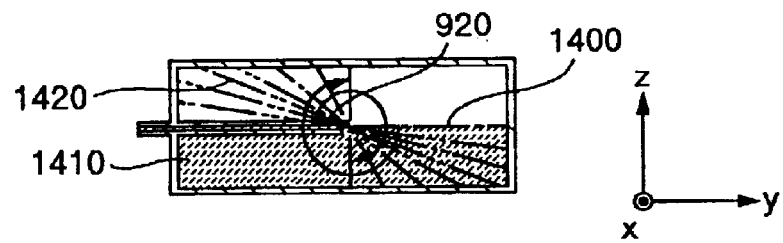
FIG. 4(b) is a transverse, cross sectional view of the tank.
Figure 4C:
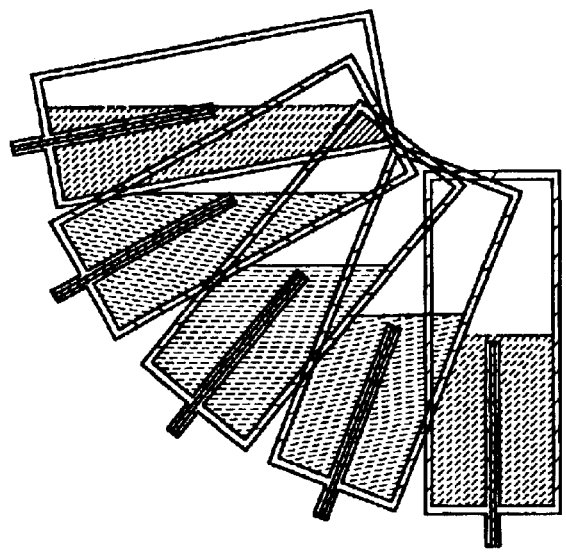
FIG. 4(c) is a view showing a manner, in which the tank is turned.

FIG. 4 schematically shows the cooling liquid tank 1300. In an example shown in FIG. 4, the gas entering preventing mechanism is provided in the cooling liquid tank 1300. FIG. 4(*a*) is a view showing the tank 1300 as viewed from a front thereof. FIG. 4(*b*) is a transverse cross sectional view showing the tank 1300. Also, FIG. 4(*c*) is a view showing a condition in which the tank 1300 is turned.

In FIG. 4(*a*), heat radiating pipes 910, 920 are connected to the tank 1300. In the embodiment, the tank 1300 is square in shape. The heat radiating pipe 910 is one on a side of an inflow end 915, through which the cooling liquid flows into the cooling liquid tank 1300. The heat radiating pipe 920 is one on a side of an outflow end 925, through which the cooling liquid flows out of the cooling liquid tank 1300. Accordingly, the cooling liquid flows into the tank 1300 from the heat radiating pipe 910 and flows out of the tank 1300 from the heat radiating pipe 920.

FIG. 4(*b*) shows a cross section taken along a line IVb—IVb in FIG. 4(*a*) in a state that the tank 1300 is disposed in a horizontal position.

The liquid cooling mechanism according to the embodiment is applied to a notebook-sized personal computer, and the tank 1300 is provided in the display casing 200. Therefore, a liquid surface in the tank 1300 will be varied in position according to an angle, at which the display casing 200 is used. FIG. 4(*c*) shows how the liquid surface is varied according to an angle, at which the display is used.

A liquid surface 1400 corresponds to a critical liquid level, at which entering of air into the outflow end 925 is inhibited. The critical liquid level 1400 is varied depending upon a position, in which the tank 1300 is arranged.

In FIG. 4(*b*), the outflow end 925 is positioned centrally (center) of the tank 1300. In this case, in order that the outflow end 925 be immersed in the cooling liquid 1410 whatever angle the display casing 200 is inclined at, the cooling liquid must have an amount half as a volume of the tank 1300. Accordingly, whatever the cross section is as shown in FIGS. 4(*b*) and 4(*c*), a liquid surface of the cooling liquid in this case corresponds to half as a height of the cross section. That is, the liquid level (critical liquid level) 1400 at that time corresponds to half as the height of the cross section shown in FIG. 4(*b*).

In this manner, provided that the outflow end 925 is arranged as shown in FIG. 4, an interface at the time of movement and turning is made most stable in position relative to the outflow end 925 whatever angle the tank 1300 is inclined at. The critical liquid level is also positioned corresponding to half as a thickness of the tank 1300. In addition, when the cooling liquid 1410 is decreased in residual amount to correspond to, or be short of the critical liquid level 1400, the outflow end 925 is exposed to the air layer, so that air enters the circulation path.

In addition, in the case where an orientation, in which a display is used, is fixed to some extent as in the notebook-sized personal computer according to the embodiment, a position, in which the outflow end is arranged, can be adjusted in view of such orientation. More specifically, the display casing 200 will not be turned in a negative direction relative to the body casing. In some cases, a configuration affords turning of about 200 degrees or more in an opposite direction.

Accordingly, for example, in the case where the tank 1300 shown in FIG. 4(*a*) is mounted in the display casing 200 as shown in FIG. 2, the outflow end is not arranged in the middle but may be arranged in a position distant −alpha (alpha>0) from a midpoint of a side in a y-direction. The reason for this is that since the display casing 200 seldom faces downward, an air layer 1420 also seldom comes downward in the y-direction and so there is caused no problem even when the outflow end 925 is positioned a little downward. In this manner, in view of those conditions, under which a configuration (the display casing 200) including the tank 1300 is used, the outflow end 925 can be arranged to get out of the center of the tank 1300 provided that no influence is had on use.

In this manner, the outflow end 925 always exists in the liquid in the cooling liquid tank 1300 shown in FIG. 4, so that it is possible to prevent air from entering inside.

Next, a further example of a gas entering preventing mechanism will be described with reference to FIGS. 5 to 8.

Figures 5A, 5B, 5C:
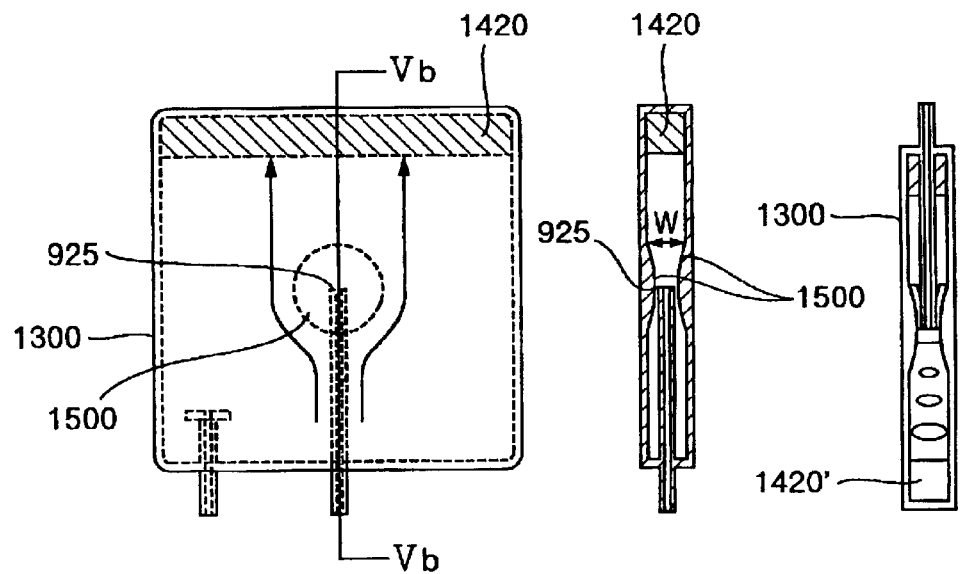
FIG. 5(a) is a front view of the tank.
FIG. 5(b) is a cross sectional view taken along a line Vb—Vb in FIG. 5(a)
FIG. 5(c) is a view similar to FIG. 5(b), showing the state in which the tank is turned 180 degrees from the state shown in FIG. 5(b), and FIGS. 5(d) to 5(g) are front views of other tanks.
Figures 5D, 5E, 5F, 5G:
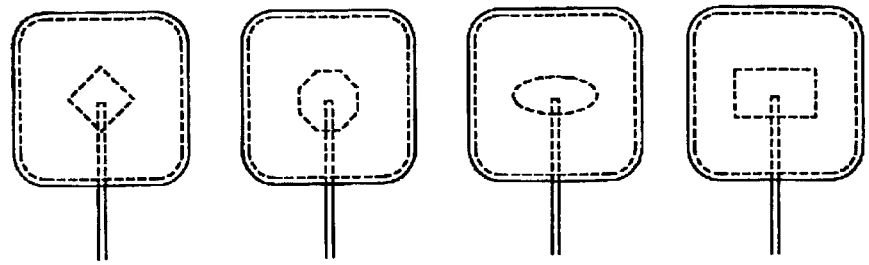

First, FIG. 5 shows examples in which a gas entering preventing mechanism is provided on inner walls of the tank 1300. FIG. 5(*a*) is a front view of the tank 1300. FIG. 5(*b*) is a cross sectional view of the tank 1300. FIG. 5(*c*) is a view of the tank 1300, in which the tank is turned 180 degrees from the state shown in FIG. 5(*b*).

In FIG. 5, a new configuration, which is different from that of FIG. 4, comprises projections 1500 provided on inner walls of the tank 1300. The projections 1500 constitute the gas entering preventing mechanism. As shown in FIGS. 5(*a*) and 5(*c*), the projections 1500 in the embodiment have a periphery in the form of a circle about the outflow end. Also, the projections 1500 protrude toward the outflow end 925 in a spherical manner.

Referring to FIG. 5, an explanation will be given to a path of movement of the air layer 1420 when the cooling liquid tank 1300 is rapidly turned upside down 180 degrees. When the air layer 1420 having been positioned prior to movement (state shown in FIG. 5(*b*)) is rapidly turned upside down, it is momentarily shifted to a lower portion of the cooling liquid tank. Thereafter, the air layer is gradually moved to an upper portion of the tank by virtue of gravity to come to a position 1420' after the movement.

It is conceivable that air will possibly enter inside the outflow end 925 when the air layer is moved in the above manner. In order to prevent entry of the air into the outflow end 925, projections 1500 are provided in the vicinity of the outflow end 925 in the embodiment shown in FIG. 5 to narrow that path near the outflow end 925, through which the air layer passes. The reason for the provision of a gap is that the cooling liquid flow into the outflow end 925. The projections 1500 offer resistance at the time of passage of the air layer 1420 to make it hard for the air layer to pass near the outflow end 925. With such arrangement, it is possible to avoid the air from entering the pump from the circulation path.

In this embodiment, since the projections 1500 have a circular periphery, entry of the air layer can be prevented in whatever direction the tank is turned, as in the case where it is turned in a left-right direction as well as in the case where it is turned upside down. The projections may have a periphery in the form of an ellipse, an octagon, and a rhombus as well as a circle.

Further, in the case where a direction, in which the tank is turned, is fixed to a specific direction, it suffices that the projections have a periphery shaped to make it hard for the air layer to pass in the direction, in which the tank is turned. In the case where turning in a vertical direction (y-direction in FIG. 4) is primary as in, for example, notebook-sized personal computers, the projections may have a periphery in the form of a rectangle, a quadrangle, or the like. FIGS. 5(*d*) to 5(*g*) show further examples of the periphery of the projections.

Further, while the projections have a spherical-shaped surface as shown in FIG. 5(*b*), the surface is not limited to such shape but may be shaped otherwise, such as a mountain-shape facing toward the outflow end 925. However, a configuration, in which a width w between the inner walls of the tank 1300 is the narrowest in a region close to the outflow end 925 and the projections are inclined outward, is optimum. When the width is small, pressure to be applied on the air is increased, and when the width is large, the pressure is decreased. Accordingly, the air becomes further hard to approach surroundings of the projections 1500, and even if the air approaches the projections 1500, it will not stagnate in the vicinity of the projections 1500 but will be readily guided outside the projections 1500.

In addition, while the outflow end 925 is arranged in the center of the tank 1300 in this embodiment, it may be arranged in a position offset from the center as described with reference to FIG. 4 as circumstances require.

In FIG. 6 and the following drawings, an explanation will be given to an example, in which gas blocking walls are provided around the outflow end 925 to serve as a gas entering preventing mechanism.

FIG. 6(*a*) is a view showing a tank 1300 with a cover plate thereof removed, as viewed from a front thereof. FIGS. 6(*b*)

and 6(c) are cross sectional views showing the cover plate and a tank body. FIG. 6(d) is a cross sectional view showing the tank with the cover plate mounted. In FIG. 6, a new configuration, which is different from that of FIG. 4, comprises gas blocking walls 1600 provided around the outflow end 925. Unlike the configuration shown in FIG. 5, in which the inner walls are changed in shape, the gas blocking walls serve to block passage of the air in the vicinity of the outflow end 925 to make it hard for the air to enter the outflow end 925.

The gas blocking walls 1600 shown in FIG. 6(a) comprises four hook-shaped or doglegged walls that are combined together. The doglegged walls are arranged in four vertical and horizontal directions of the outflow end 925 to face outward. Also, gaps (passages) are formed between the respective walls to cause the cooling liquid to flow into the outflow end 925.

In the case where turning of the tank 1300 is mostly made in the vertical direction as in notebook-sized personal computers, a direction, in which the air layer moves, is mostly vertical. In such case, an amount of the air layer entering the passages can be decreased by virtue of a configuration, in which the passages, respectively, toward the outflow end 925 are formed in oblique directions as shown in FIG. 6(a).

Also, a configuration may be added, in which tip ends of the passages have a small width 1604 and portions of the passages in the vicinity of the outflow end have a large width 1602 as shown in FIG. 6(a). With such arrangement, it is possible to prevent the air from entering inside the gas blocking walls 1600 and to smoothly discharge the entered air.

In addition, while the gas blocking walls 1600 in the configuration shown in FIG. 6(a) are formed to be doglegged, even a combination of straight walls can prevent some air from entering the outflow end 925. Such example is shown in FIG. 6(e). Further, in the case where turning of the tank is mostly made in the vertical direction, vertically faced blocking walls 1600 may be provided as shown in FIG. 6(f).

However, a configuration is preferable, in which the air is guided outwardly of the outflow end 925 at ends of the walls as in the doglegged walls and as shown in FIG. 6(g). This is because the air having struck against the walls can be prevented from being carried along the walls to enter the outflow end 925 from the gaps (passages) between the walls. For example, in the case where the air layer is moved in the vertical direction, the air strikes against recesses on the doglegged walls to advance obliquely along the walls, so that when the air is moved to ends of the walls, it will have a velocity component in an obliquely outward direction, which energizes and moves the air outside the gas blocking walls, thereby enabling making it hard for the air to enter.

Further, it is possible to combine the respective configurations together. A configuration shown in FIG. 6(h) is a combination of the configurations shown in FIGS. 6(a) and 6(e). In the configuration shown in FIG. 6(h), the configuration shown in FIG. 6(e) is turned 45 degrees to be overlapped on the configuration shown in FIG. 6(a), thus forming a double gas blocking walls. Such overlapping of the configuration turned 45 degrees enables decreasing the air entering the outflow end 925 at the time of movement of the air layer not only in the vertical and horizontal directions but also in diagonal directions without hindering outflow of the cooling liquid from the tank 1300.

Then, an explanation will be given to deformation of the cooling liquid tank 1300 due to internal pressure with reference to FIG. 7.

The air layer and the cooling liquid in the closed cooling liquid tank 1300 are increased or decreased in volume due to temperature variation. Such volumetric change causes a change in internal pressure within the tank 1300, by which load is applied on respective surfaces of the cooling liquid tank. Accordingly, the tank 1300 desirably has a structure capable of bearing the load.

An explanation will be given to a load resistant structure in the case of the cooling liquid tank 1300 having a structure of, for example, the gas blocking walls 1600 illustrated in FIGS. 6(a) to 6(d). As shown in FIG. 6(d), the tank 1300 comprises a housing composed of the cover plate 1700, a bottom-plate cover 1710, and side-surface walls 1720. The gas blocking walls 1600 are joined to an inner wall of the cover plate and an inner wall of the bottom-plate cover, respectively. That is, the gas blocking walls 1600 constitute a support for the cover inner walls.

Figure 7A:
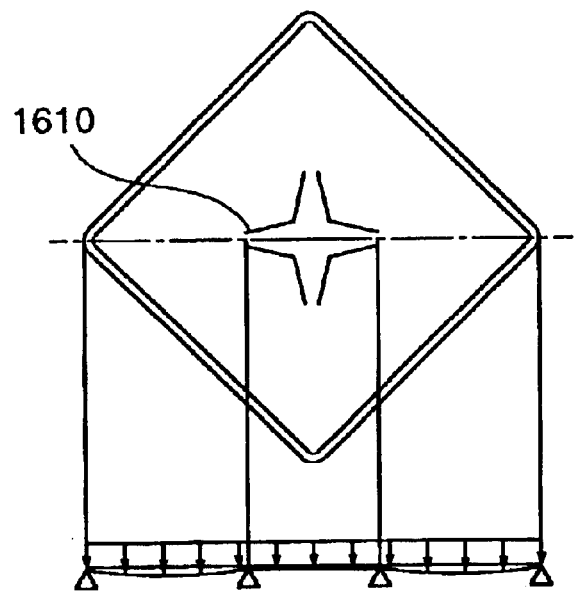
FIGS. 7(a) to 7(c) are views showing an amount of deformation of a cover plate experienced by temperature drop of the cooling liquid and an air layer.

FIG. 7(a) shows an amount of deformation experienced by the cover plate in the case where temperatures drops to cause contraction of the cooling liquid and the air layer. As shown in FIG. 7(a), joint surfaces 1730 together with side-surface walls 1720 of the housing support the respective inner walls.

In this manner, the structure, in which the joint surfaces 1730 are provided for the gas blocking walls and the cover plates, serves as a reinforcement member for reinforcing the tank. That is, a span between one support and an adjacent support is shortened. Accordingly, it is possible to decrease an amount of deformation caused by a volumetric change of the cooling liquid or the like in the tank 1300. Also, since the side walls of the housing and the gas blocking walls constitute supports, a load on one support can be reduced as compared with the case where supports are provided only by the side walls. With such arrangement, the cooling liquid tank 1300 can be increased in resistance to a load.

Figure 7B:
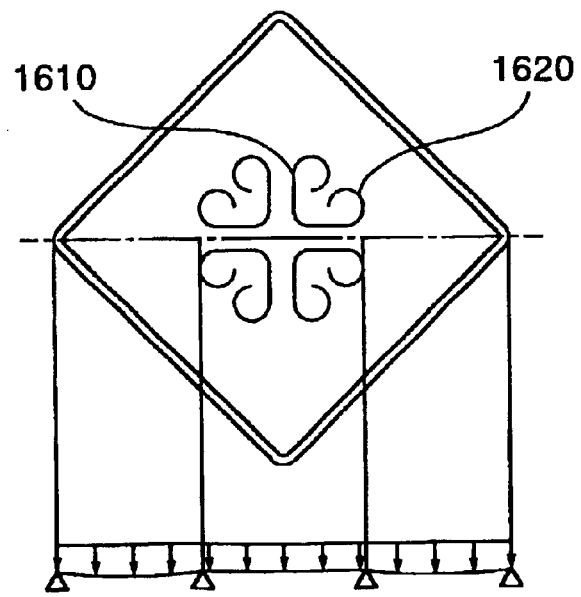

FIG. 7(b) shows a further example of gas blocking walls. In FIG. 7(b), the gas blocking walls shown in FIG. 6(a) are modified to assume a shape 1620 with ends thereof rounded inside. This is because of the following reason.

In FIG. 7(a), a maximum stress is liable to be applied on supports 1610, which are arranged close to diagonals where the supports have a large span therebetween. In this manner, when ends of joint surfaces are disposed in locations where the maximum stress is liable to be applied, there is a possibility of breakage during volumetric change cycles. Accordingly, with the arrangement shown in FIG. 7(b), the ends of the joint surfaces get out of surroundings of the supports 1610, to which the maximum stress is applied, to thereby increase the gas blocking walls 1600 further in fracture strength.

Figure 7C:
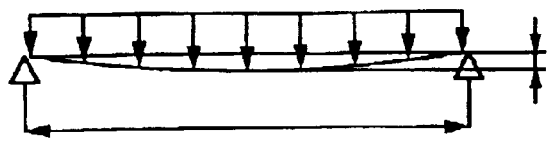
Figure 8A:
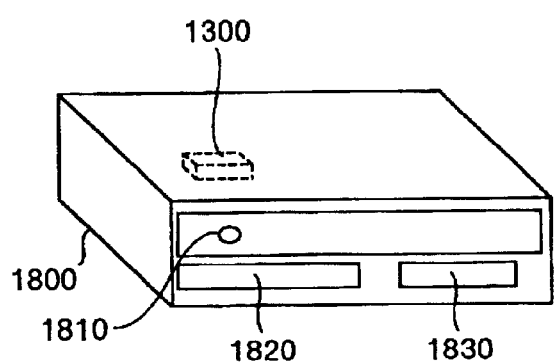
FIGS. 8(a) to 8(e) are views showing an example, in which the present invention is applied to a desktop computer.
Figure 8B:
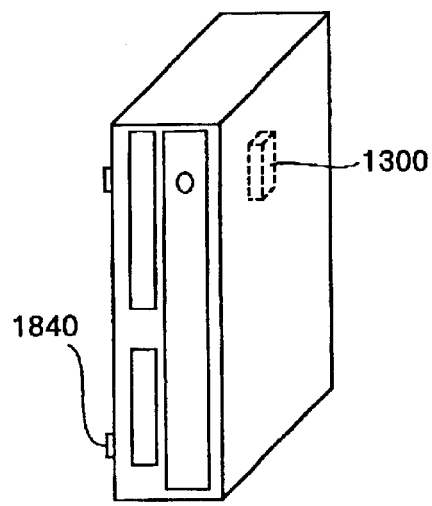
Figure 8C:
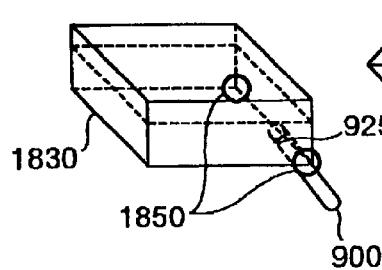
Figure 8D:
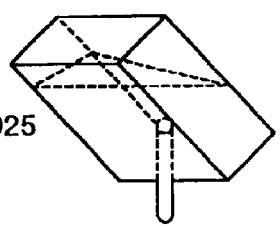
Figure 8E:
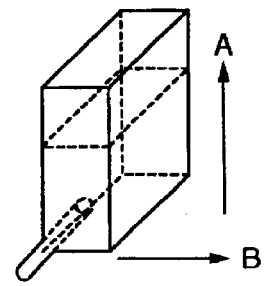

FIG. 7(c) shows an amount of deformation experienced by a cover plate without supports. Thus, an amount of deformation in the case where supporting is provided only by side walls of the housing of the tank 1300 is greater than that in the case where supports are provided.

In addition, while the gas blocking walls 1600 in the example shown in FIG. 7 are configured to be also used as supports, the supports may be configured separately from the gas blocking walls. For example, struts may be provided inside the tank 1300 separately from the gas blocking walls 1600 to be configured as supports.

Also, FIG. 7 illustrates a configuration, in which the gas blocking walls 1600 make supports to thereby increase the tank in durability but such configuration is not limitative. For example, FIG. 5 shows the configuration, in which the cover plate and the housing body are partially thickened. In this manner, fracture strength can be increased by thickening those portions of the tank, on which stress is liable to be applied.

While description has been given to the embodiments, in which the gas entering preventing mechanism is provided in the cooling liquid tank 1300, a gas entering preventing mechanism may be provided in other locations as described below. In the above embodiments, the heat radiating pipes are comparatively small in cross sectional area. However, use of pipes having a large cross sectional area reduces power required for circulating the cooling liquid through the heat radiating pipes, or the like.

In such case, it is possible to provide the gas entering preventing mechanism in the heat radiating pipes. That is, the gas entering preventing mechanism as shown in FIG. 6 and the like can be provided in at least one location in the heat radiating pipes housed in the display casing 200. Application of such arrangement is conceivable in the case where an air layer is formed within thick heat radiating pipes, for example, when the cooling liquid tank 1300 is arranged not in the position shown in FIG. 3 and the like but below the display casing 200.

Subsequently, an embodiment, in which the invention is applied to desktop computers, will be described with reference to FIG. 8. In FIG. 8(*a*), a desktop computer comprises on a front surface of a housing 1800 a button 1810 for power-on operation, a CD-ROM drive 1820, a flexible disk drive 1830, and so on. Also, an internal processor is structured to be cooled by a cooling liquid mechanism according to the invention. In the drawings, a cooling liquid tank 1300 according to the invention is specifically indicated by dotted lines. Also, the reference numeral 1840 in FIG. 8(*b*) denotes legs (struts) for use in the case where the computer is placed in a horizontal position.

Unlike notebook-sized computers, desktop computers are not intended for use in a carried state but used in a fixed state. Therefore, two states in use are assumed to include one in a horizontal position as shown in FIG. 8(*a*) and one in a vertical position as shown in FIG. 8(*b*).

FIGS. 8(*c*) to 8(*e*) are views illustrating the structure of the cooling liquid tank 1300. In these drawings, an outflow end 925 of a heat radiating pipe, through which a cooling liquid flows out of the tank 1300, is shown but the remaining structure is omitted from illustration. In the embodiment, the heat radiating pipe is inserted obliquely into the tank 1300 from one corner of the tank. Such direction comprises components in an upward direction A in the case of placement in a vertical position and in a downward direction B in the case of placement in a horizontal position. Also, a location for the insertion may be at either of both ends 1850 of a side, at which a bottom surface in placement in a vertical position and a bottom surface in placement in a horizontal position adjoin each other. With such arrangement, a critical interface is varied in position depending upon a length, over which the heat radiating pipe is inserted.

In this manner, the outflow end 925 is configured to project upward from a lower portion of the tank 1300 whereby in whichever of placement in a vertical position and placement in a horizontal position the air layer is less likely to be taken in if a surface of the cooling liquid is flush with or above the critical interface.

In addition, the embodiments shown in FIGS. 4 to 7 can also be applied to the case of desktop computers. Also, while application of the invention to computers has been described, the invention can be further applied to electronic devices having semiconductor devices, in which generation of heat causes a problem.

The description has been given above to the construction, in which entering of air into a pump is prevented when air layer is present in a tank. Subsequently, description will be given to a construction intended for lessening entering of air into a tank, or evaporation of a cooling liquid from a tank. The tank serves as replenishment of a liquid medium permeating or evaporating from a whole water-cooled structure during cooling. Since the tank is large in surface area when comparing respective parts of the water-cooled structure with one another, however, there is caused a problem that the liquid medium, permeation or evaporation of which the tank is responsible for, becomes large in amount.

Figure 9:
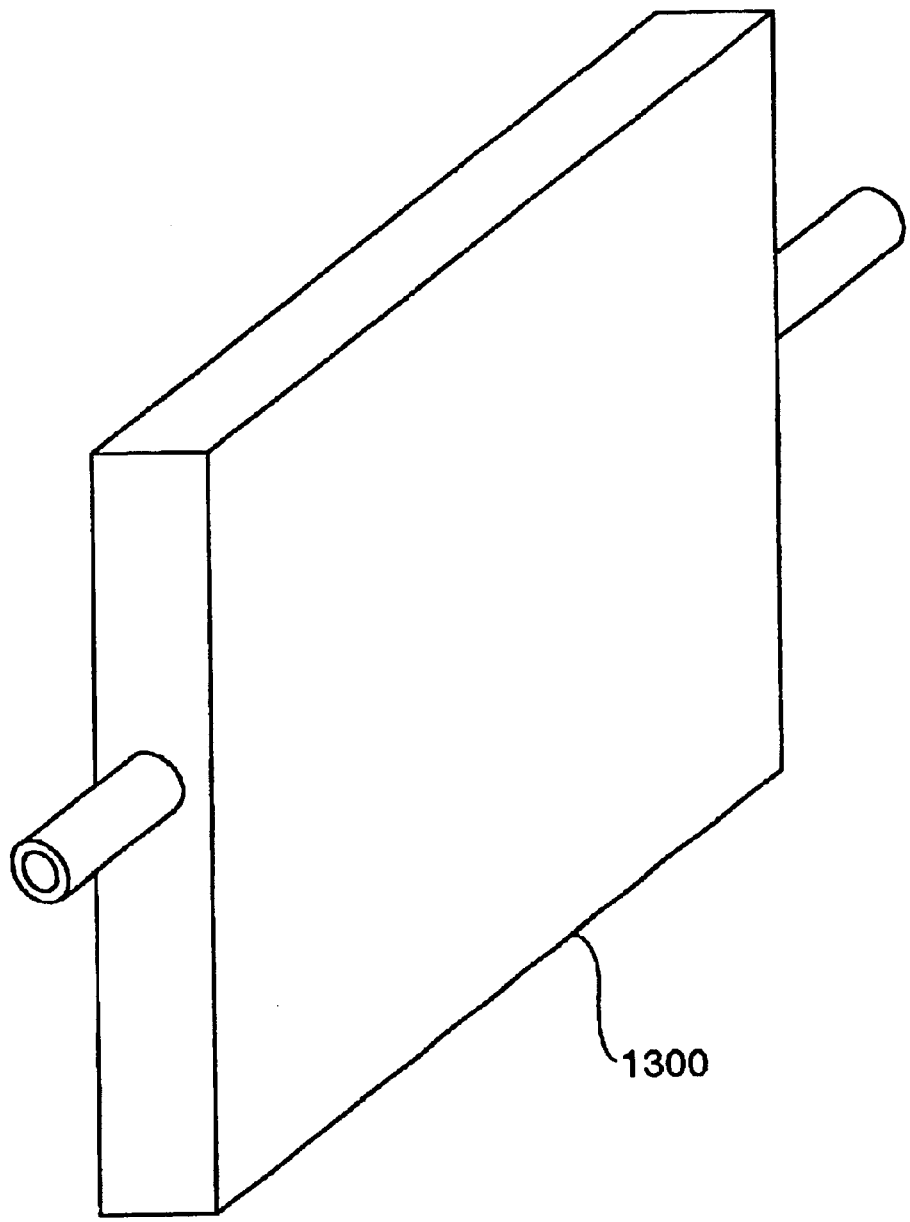
FIG. 9 is a perspective view of a tank according to the invention.
Figure 10A:
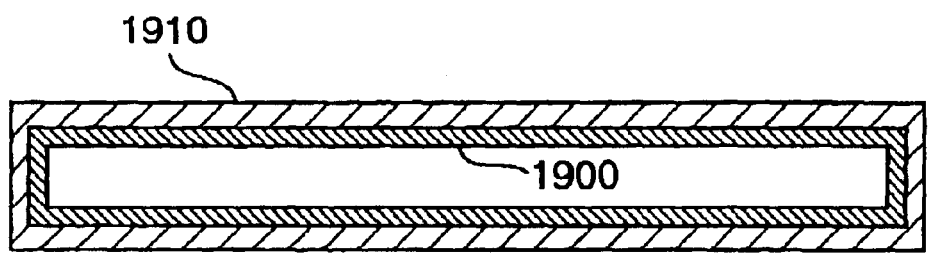
FIGS. 10(a) and 10(b) are cross sectional views of the tank shown in FIG. 9.
Figure 10B:
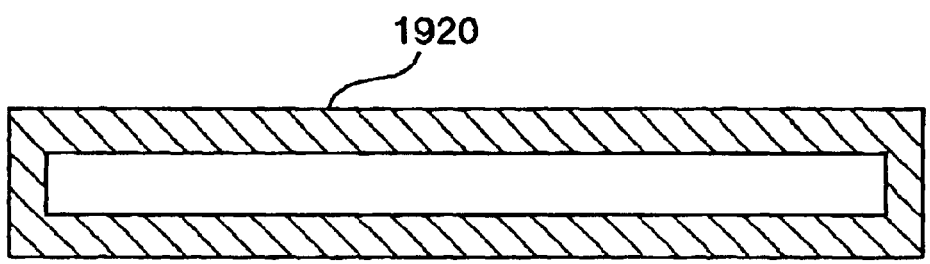

Hereupon, a structure intended for reducing an amount of a liquid medium permeating a tank for storing the liquid medium is shown in FIGS. 9 and 10.

FIG. 9 is a perspective view showing a tank 1300, according to an embodiment, mounted in an electronic device.

Surfaces of the tank 1300 are plated with a metal, such as nickel, aluminum, copper, stainless steel, or the like, which the cooling liquid permeates in less amount.

FIG. 10(*a*) is a cross sectional view showing a tank 1300 according to an embodiment of the invention.

Plastics 1900 constituting the tank 1300 affords permeation of the liquid in large amount.

Hereupon, a thin film 1910 is formed by plating of nickel being a metal, which the cooling liquid permeates in less amount. By doing so, an amount of the liquid permeating can be decreased as compared with the case where the tank 1300 is made of plastic or acrylic. Therefore, those decrease and disappearance of the cooling liquid within the liquid cooling mechanism, which are attributed to permeation or evaporation of the cooling liquid, can be reduced while the device is made lightweight as a whole, and degradation in cooling capability and incapability of cooling can also be mitigated.

In addition, the same effect is also produced when aluminum, or copper, or stainless steel is used as a material of the thin film 1910 in place of nickel.

Further, the same effect is also produced when a material, such as isobutylene-isoprene rubber, nitrile butadiene rubber, fluoro rubber, ethylene propylene rubber, hydrin rubber, polysulfide rubber, or the like, is used as a material of the thin film 1910 in place of a metal such as nickel, aluminum, copper, or stainless steel.

Further, while the use of plating has been described as a method of surface finishing for application of these materials on surfaces of the tank in the embodiments, a physical deposition technique, for example, vacuum deposition, sputtering, or the like, suffices. In particular, a favorable adherence to the surfaces of the tank can be obtained with sputtering.

Also, as shown in FIG. 10(*b*), in place of the plastics 1900 constituting the tank 1300, a metal, such as nickel, aluminum, copper, or stainless steel, may be used to make a metallic housing 1920. With such configuration, it is possible to omit processings such as plating processing, deposition processing, or the like.

As described above, it is possible to make stable replenishment of the cooling liquid, and it is also possible to improve reliability of the liquid cooling mechanism and hence reliability of an associated electronic device.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. An electronic device comprising:
   a semiconductor device;
   a heat absorbing mechanism in contact with said semiconductor device;
   a first housing, which receives therein said semiconductor device and said heat absorbing mechanism;
   a heat radiating mechanism for radiating the heat absorbed by said heat absorbing mechanism;
   a second housing, which receives therein said heat radiating mechanism;
   a connection member connecting with said heat absorbing mechanism and said heat radiating mechanism;
   a pump for circulating a cooling liquid through said heat absorbing mechanism, said connection member, and said heat radiating mechanism, and
   a blocking mechanism for blocking flow of gas entered in the cooling liquid,
   wherein said heat radiating mechanism comprises a tank in an upper portion of said second housing to store the cooling liquid,
   said tank receives therein said blocking mechanism,
   wherein said blocking mechanism is disposed at a center of said tank, and a first end of said connection member, into which the cooling liquid flowing out of the tank flows, is disposed centrally of said blocking mechanism,
   wherein said blocking mechanism further comprises a wall arranged in a part of surroundings of said first end, and
   wherein said wall comprises a plurality of hook-shaped wall portions to be arranged around said first end.

2. The electronic device according to claim 1, wherein said tank comprises a housing having a roof-plate cover and a bottom-plate cover, and
   said wall portions adjoin said roof-plate cover and said bottom-plate cover.

3. The electronic device according to claim 1, wherein said tank comprises a housing plated with a metal.

4. The electronic device according to claim 1, wherein said semiconductor device comprises a processor,
   said first housing further comprises a mother board, and
   said second housing further comprises a display.

5. An electronic device comprising:
   a processor;
   a jacket mounted on said processor;
   a drive pump for driving a cooling liquid into said jacket;
   a first housing, which receives therein said processor, said jacket, and said pump;
   a tank for storing cooling liquid;
   a first heat radiating pipe, which allows the cooling liquid to flow from said first housing to said tank;
   a second heat radiating pipe, which allows the cooling liquid to flow from said tank to said first housing and an end of which is inserted into said tank;
   a second housing, which receives therein said tank and said first and second heat radiating pipes; and
   an air entering preventing mechanism arranged around an end of said second heat radiating pipe within said tank,
   wherein said air entering preventing mechanism comprises projections on inner walls of said tank.

6. The electronic device according to claim 5, wherein said projections have a periphery in the form of a circle.

7. The electronic device according to claim 5, wherein said air entering preventing mechanism comprises gas blocking walls provided around said end of said second heat radiating pipe.

8. The electronic device according to claim 7, wherein said gas blocking walls comprise hook-shaped walls of which projecting portions facing said end of said second heat radiating pipe and arranged on four directions of said end of said second heat radiating pipe.

9. The electronic device according to claim 8, wherein said hook-shaped walls comprise bent surfaces at both ends thereof.

* * * * *